United States Patent [19]

Murata et al.

[11] 4,232,397

[45] Nov. 4, 1980

[54] AUTOMATIC CHANNEL SELECTION APPARATUS

[75] Inventors: Toshinori Murata; Shigeo Matsuura, both of Yokohama, Japan

[73] Assignee: Hitachi, Ltd., Japan

[21] Appl. No.: 936,923

[22] Filed: Aug. 25, 1978

[30] Foreign Application Priority Data

Aug. 26, 1977 [JP]  Japan .................... 52-101750

[51] Int. Cl.³ ............................................ H04B 1/32
[52] U.S. Cl. ................................... 455/179; 455/150;
455/154; 455/161; 358/193.1
[58] Field of Search ............ 325/464, 465, 468, 470,
325/452, 453, 455, 457, 459; 334/11, 14, 18, 21;
333/72; 358/188, 191, 193

[56] References Cited

U.S. PATENT DOCUMENTS

| | | | |
|---|---|---|---|
| 3,818,353 | 6/1974 | Sakamoto | 325/470 |
| 3,936,753 | 2/1976 | Clark | 325/470 |
| 4,037,181 | 7/1977 | Ieki et al. | 333/72 |
| 4,077,009 | 2/1978 | Klank et al. | 325/453 |
| 4,126,836 | 11/1978 | McCusker | 358/138 |

*Primary Examiner*—John C. Martin
*Assistant Examiner*—Tommy P. Chin
*Attorney, Agent, or Firm*—Craig and Antonelli

[57] ABSTRACT

An automatic channel selection apparatus comprises an electronic tuner having a local oscillator an oscillation frequency of which is controlled by an applied voltage, a voltage sweep circuit for sweeping the voltage to be applied to the local oscillator, means for deriving from an output of the local oscillator, signals of different phases and combining those signals, a detector for envelope-detecting an output of the deriving means and means for counting the number of varying cycle periods in the output of the detector which changes periodically each time the oscillation frequency of the local oscillator changes by a given amount which is inversely proportional to the phase difference to change a tuning frequency of the electronic tuner by a specified amount.

5 Claims, 14 Drawing Figures

AUTOMATIC CHANNEL SELECTION APPARATUS

The present invention relates to an automatic channel selection apparatus which can automatically select a desired one of television broadcasting programs or radio broadcasting programs.

The present invention is particularly suitable for use in a television receiver or radio receiver having an electronic tuner.

In a known automatic channel selection apparatus for the television receiver, an oscillation frequency of a local oscillator of an electronic tuner is changed by an output voltage of a sawtooth wave generator circuit and the sawtooth wave generator circuit is controlled when a television signal is received to maintain the output voltage of the sawtooth generator circuit to a voltage it generated at that time.

In the known automatic channel selection apparatus described above, an output of the tuner is passed through a video intermediate frequency narrow band pass filter to extract a video intermediate frequency component, which is detected by a detector circuit, an output of which is supplied to a sawtooth wave control circuit, an output of which is used to control a sawtooth wave generator circuit. When a television signal is not being received, no video intermediate frequency component is extracted at the output of the narrow band pass filter and hence no voltage is produced at the output of the detector circuit. Therefore, the sawtooth wave control circuit is not operated by the output of the detector circuit so that the output voltage of the sawtooth wave generator continues to rise. Thus, the local oscillation frequency of the tuner changes in accordance with the output voltage of the sawtooth wave generator circuit.

When the television signal is received, the video intermediate frequency component is extracted at the output of the video intermediate frequency narrow band pass filter, and it is detected by the detector circuit and then supplied to the sawtooth wave control circuit. As a result, the sweep of the output voltage of the sawtooth wave generator circuit is stopped by the output of the sawtooth wave control circuit and the output voltage of the sawtooth wave generator circuit is maintained at the voltage when the sweep was stopped. In this manner, the channel selection is completed.

In the circuit configuration described above, it occurs that an output voltage is also extracted at the output terminal of the narrow band filter when an audio carrier wave is converted to a video intermediate frequency by the tuner and the sweep of the output voltage of the sawtooth wave generator circuit is stopped by the output voltage of the narrow band filter.

In order to overcome the above drawback, an automatic channel selection apparatus has been proposed in which a narrow band filter for extracting an audio intermediate frequency component is provided and an output of the audio intermediate frequency narrow band pass filter is detected by an audio intermediate frequency detector circuit so that the video intermediate frequency filter is activated only when a detected voltage is extracted at the output of the audio intermediate frequency detector circuit and the sweep of the output voltage of the sawtooth wave generator is stopped only when the video intermediate frequency filter is activated and the video intermediate frequency component is extracted at the output of the video intermediate frequency filter.

In the proposed automatic channel selection apparatus, the voltage sweep is automatically stopped, that is, the rise of the output voltage of the sawtooth wave generator is stopped when a broadcasting wave is present to enable automatic reception of the broadcasting wave.

However, in the proposed automatic channel selection apparatus, since the sweep is stopped when the broadcasting wave is present, one cannot know what station broadcasting wave is being received. Accordingly, when this channel selection apparatus is used in a television receiver, one cannot know what channel is being received unless he checks a broadcasting program table.

Furthermore, since the broadcasting waves are sequentially selected, it is impossible to directly select a desired channel and a delay occurs before the desired channel is selected.

It is an object of the present invention to provide a novel automatic channel selection apparatus.

It is another object of the present invention to provide an automatic channel selection apparatus which can directly select a desired channel.

It is another object of the present invention to provide an automatic channel selection apparatus which can indicate a selected channel.

In order to achieve the above objects, the automatic channel selection apparatus of the present invention comprises an electronic tuner having a local oscillator an oscillation frequency of which is controlled by an applied voltage, a voltage sweep circuit for sweeping the voltage applied to the local oscillator, means for deriving from an output of the local oscillator, signals of different phases and combining those signals, a detector for envelope-detecting an output of the deriving means and means for counting the number of varying cycle periods in the output of the detector which changes periodically each time the oscillation frequency of the local oscillator changes by a given amount which is inversely proportional to the phase difference to change a tuning frequency of the electronic tuner by a specified amount.

Referring to the accompanying drawings, preferred embodiments of the automatic channel selection apparatus of the present invetion applied to a television receiver are explained.

Figure 1:
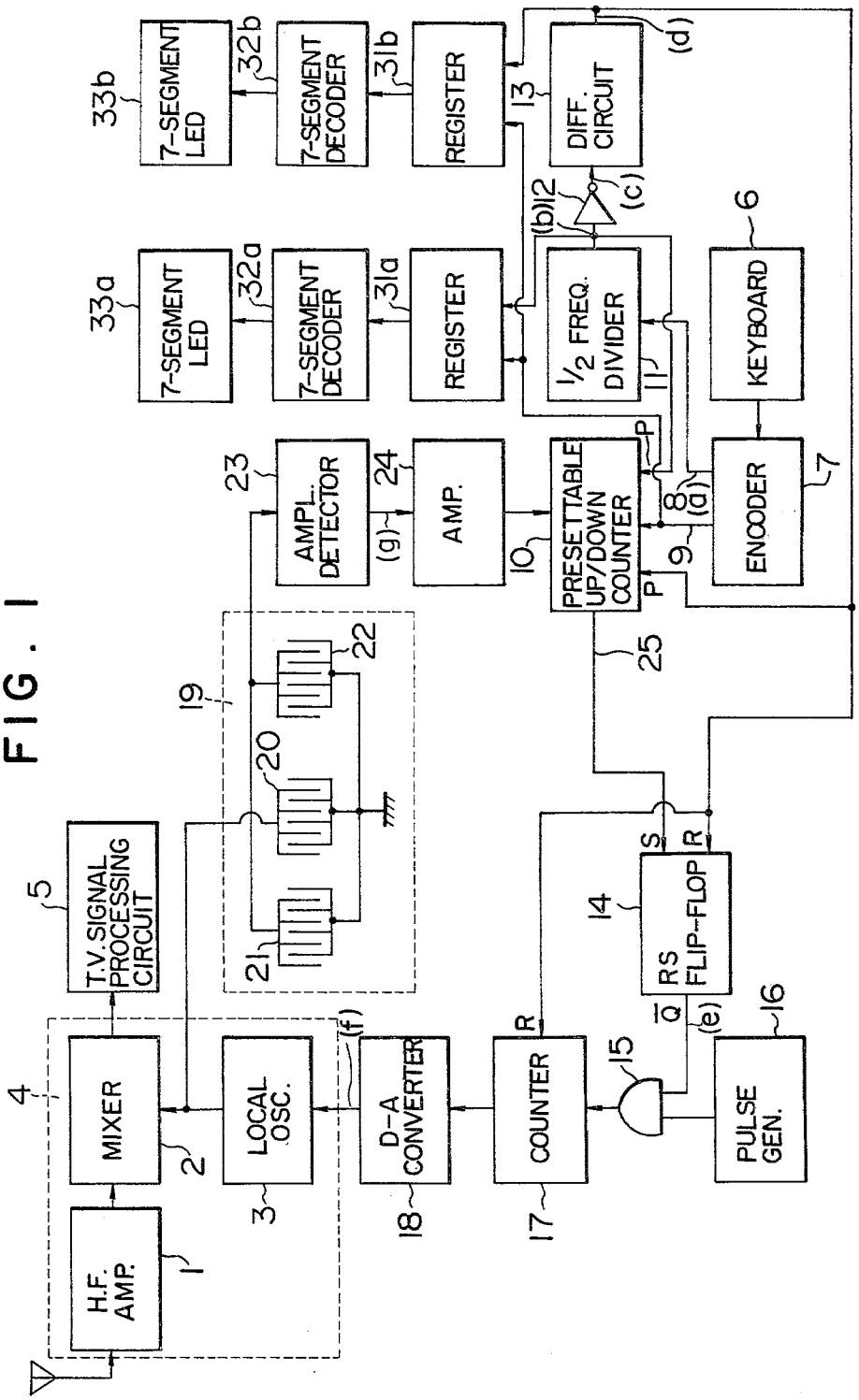
FIG. 1 is a block diagram showing one embodiment of an automatic channel selection apparatus of the present invention.

In FIG. 1, numeral 1 denotes a high frequency amplifier, numeral 2 denotes a mixer and numeral 3 denotes a local oscillator, an oscillation frequency of which changes in accordance with an applied voltage. The amplifier 1, the mixer 2 and the local oscillator 3 constitute an electronic tuner 4. Numeral 5 denotes a television signal processing circuit which constitutes a portion of the television receiver other than the television tuner and which includes an intermediate frequency amplifier circuit, a video detector circuit, a video amplifier circuit, an audio circuit, a synchronization circuit, a deflection circuit and a CRT. Numeral 6 denotes a known keyboard which has switches having numerals 0-9 marked thereon. When a channel is to be selected, a switch of the keyboard 6 which is marked with a numeral corresponding to the desired channel number is depressed. For example, when channel 4 is to be selected, the switches on the keyboard 6 which are marked with the numerals 0 and 4 are sequentially depressed, and when channel 12 is to be selected, the switches on the keyboard 6 which are marked with the numerals 1 and 2 are sequentially depressed. Numeral 7 denotes an encoder which may be a decimal-to-binary encoder shown in "Design of Digital System" by Kunio Inokai, published by CQ Publishers, especially FIG. 3.54 (b).

By depressing a switch on the keyboard 6 which corresponds to a tens digit of a desired channel number (when the desired channel number is of one digit, depress the #0 switch) and then depressing a switch corresponding to a unit digit of the desired channel number, a first key pulse caused by the depression of the switch corresponding to the tens digit followed by a second key pulse caused by the depression of the switch corresponding to the unit digit is produced at a first terminal 8 of the encoder 7, as shown in FIG. 2A. The encoder 7 has a second group of terminals 9. In the present embodiment of this invention, the tens digit and the unit digit of the channel number are respectively converted to 4-bit coded signals by the encoder 7. In this case, the second group 9 of terminals thus comprises four terminals. Numeral 10 denotes a presettable up/down counter which includes a first preset terminal for the tens digit, a second preset terminal for the unit digit, a data input terminal and a clock terminal. The first and second key signals shown in FIG. 2A, taken from the first terminal 8 of the encoder 7 are supplied to a ½ frequency divider 11, which produces a pulse train as shown in FIG. 2B, which is supplied to the tens digit preset terminal of the presettable up/down counter 10 and an inverter 12. The signal shown in FIG. 2B is inverted by the inverter 12, which produces a signal shown in FIG. 2C, which is supplied to a differentiation circuit 13. The signal shown in FIG. 2C is differentiated by the differentiation circuit 13 which produces a signal shown in FIG. 2D, which is applied to the unit digit preset terminal of the presettable up/down counter 10. When the output signal (b) of the ½ frequency divider 11 is applied to the tens digit preset terminal of the presettable up/down counter 10, the counter 10 is preset at the rise of the signal (b) and a 4-bit coded signal representing the tens digit of the channel number taken from the terminal 9 is stored in a tens digit memory circuit in the counter 10. Then, the output signal (d) of the differentiation circuit 13 is applied to the unit digit preset terminal of the presettable up/down counter 10. At this time, a 4-bit coded signal representing the unit digit of the channel number is produced at the second terminal 9 and it is stored in a unit digit memory circuit in the counter 10 while the output signal (d) is being applied to the unit digit preset terminal. In this manner, the tens digit and the unit digit of the channel number are stored in the counter 10 in the form of 4-bit coded signal.

The output signal (d) of the differentiation circuit 13 is applied to a reset terminal of an RS flip-flop 14. Before the signal (d) is applied to the reset terminal of the RS flip-flop 14, a voltage at a $\overline{Q}$ output terminal is at LOW level. When the signal (d) is applied to the reset terminal, the voltage at the $\overline{Q}$ output terminal rises to HIGH level so that a voltage as shown in FIG. 2E is produced at the $\overline{Q}$ output terminal. The $\overline{Q}$ output terminal is connected to one input terminal of an AND circuit 15. The other input terminal of the AND circuit 15 receives pulses from a pulse generator 16. When the voltage at the $\overline{Q}$ output terminal, that is, the voltage at the one input terminal of the AND circuit 15 rises to HIGH level, the pulses from the pulse generator 16 are applied to a counter 17 through the AND circuit 15. The output signal (d) of the differentiation circuit 13 is applied to a reset terminal of the counter 17 so that the counter 17 is reset to zero by the differentiated pulse. Accordingly, the counter 17 starts to count from count 1 the pulses from the pulse generator 16 which are supplied through the output of the AND circuit 15. An output of the counter 17 is applied to a D-A converter 18 so that the D-A converter 18 produces a gradually increasing output voltage as shown in FIG. 2F. This voltage is supplied to the local oscillator 3 as a sweeping voltage so that the oscillation frequency of the local oscillator 3 gradually increases by the gradually increasing sweeping voltage. The RS flip-flop 14, the pulse generator 16, the AND circuit 15, the counter 17 and the D-A converter 18 constitute a voltage sweeping circuit.

The oscillation signal from the local oscillator 3 is applied to an input electrode of an elastic surface wave element 19, which has an input electrode 20 and output electrodes 21 and 22. The input and output electrodes are arranged such that the distance between a center of the input electrode 20 and a center of the output electrode 21 is different from the distance between the center of the input electrode 20 and a center of the output electrode 22. With this arrangement, phases of signals taken from the output electrodes 21 and 22 differ from each other relative to the local oscillation signal applied to the input electrode 20. The local oscillation signals of different phases taken from the output electrodes 21 and 22 are combined together and the combined signal is supplied to an amplitude detector 23.

In general, a sum V of two signals having a delay time difference of τ relative to a signal of frequency f can be expressed by;

$$V = V_o(e^{jwt} + e^{jw(t-\tau)}) \tag{1}$$

where $V_o$ is an amplitude of each signal and $w = 2\pi f$. Accordingly, an amplitude (V) of the combined signal V is given by;

$$|V| = V_o|e^{jwt} + e^{jw(t-\tau)}| = V_o\sqrt{2(1+\cos w\tau)} \tag{2}$$

Thus, $|V|$ is maximum or equal to $2V_o$ when $w = 2N\pi/\tau$ or $f = N/\tau$ (where N is an integer), and it is minimum or equal to 0 when $w = (2N+1)\pi/\tau$ or $f = (N+\frac{1}{2})/\tau$ (where N is an integer). Accordingly, a frequency interval Δf between adjacent maximum values is given by;

$$\Delta f = \frac{N+1}{\tau} - \frac{N}{\tau} = \frac{1}{\tau} \tag{3}$$

when $\tau$ is constant, the maximum value appear at an equal interval.

Accordingly, when the two signals having the delay time difference of $\tau$ are combined and the combined signal is amplitude-detected, the detection output derived by frequency sweeping assumes the maximum value each time the frequency changes by $1/\tau$.

The present invention makes use of the above phenomenon. That is, the phase difference (delay time difference) of the two signals to be combined is selected such that the amplitude of the combined signal assumes the maximum value each time the frequency of the local oscillation signal from the local oscillator 3 changes from one channel to the next channel to select the next channel. In the elastic surface wave element 19 shown in FIG. 1, when the center-to-center distance between the electrodes 20 and 21 is given by $l_1$ and the center-to-center distance between the electrodes 20 and 22 is given by $l_2(l_1 < l_2)$, and a propagation velocity of a surface wave is given by v, a propagation time $t_1$ from the electrode 20 to the electrode 21 and a propagation time $t_2$ from the electrode 20 to the electrode 22 are expressed by;

$$t_1 = \frac{l_1}{v}, \quad t_2 = \frac{l_2}{v} \quad (t_1 < t_2)$$

accordingly, the signals developed at the electrodes 21 and 22 have a phase difference therebetween correspoinding to the time difference of $\Delta t = t_2 - t_1$. Thus, the time difference $\Delta t$ may be chosen such that the amplitude of the sum of the signals taken from the electrodes 21 and 22 assumes the maximum value each time the respective channel is selected.

In Japan, since the television broadcasting channels are established at intervals of 6 MHz, the distance between the electrodes 20 and 21 and the distance between the electrodes 20 and 22 may be selected to assure $\Delta t = 1/6 \,\mu s$. The local oscillation signals taken from the electrodes 21 and 22 are combined and the combined signal is supplied to the amplitude detector 23 so that the output of the amplitude detector 23 assumes the maximum value each time the local oscillation signal of the local oscillator 3 changes by 6 MHz. By selecting $\Delta t$ to comply with the television broadcasting channel system of the local country, a signal which assumes the maximum value only when the local oscillation signal changes to a frequency which enables the reception of the television signal, as shown in FIG. 2G is produced at the output of the amplitude detector 23. Therefore, by counting the number of peaks of the output voltage of the amplitude detector 23 and stopping the sweep of the sweeping voltage supplied to the local oscillator 3 when the count reaches a desired channel to maintain the sweeping voltage at that moment, the desired channel can be selected.

The output signal (g) of the amplitude detector 23 is amplified by an amplifier 24, an output of which is applied to the clock terminal of the presettable up/down counter 10. When the signal (g) is applied to the clock terminal of the counter 10, the channel number stored in the memory circuits of the counter 10 is sequentially decreased, and when the channel number reaches 0, that is, when that number of peaks of the signal (g) which enables the reception of the desired channel have been applied to the counter 10, a borrow signal is produced at a borrow terminal 25 of the counter 10. This borrow signal is applied to the set terminal of the RS flip-flop 14 so that the $\overline{Q}$ output terminal thereof assumes LOW level. As a result, the pulses from the pulse generator 16 are no longer supplied to the counter 17 through the AND circuit 15.

Accordingly, the content of the counter 17 and the output of the D-A converter 18 are fixed to the values they had when the borrow signal was produced from the counter 10 so that the frequency of the oscillation signal of the local oscillator 3 is fixed to the value which enables the reception of the desired channel.

A channel indicator is now explained. It comprises registers 31a and 31b, 7-segment decoders 32a and 32b, and 7-segment light emitting diodes 33a and 33b. When the output signal (b) of the ½ frequency divider 11 is supplied to the reset terminal of the register 31a for the tens digit of the channel number, the 4-bit coded signal representing the tens digit of the channel number taken from the second terminal 9 of the encoder 7 is applied to the register 31a and stored therein. The 4-bit coded signal representing the tens digit of the channel number is also applied to the register 31b, but it is not stored in the register 31b because no signal is being applied, at this time, to a preset terminal of the register 31b.

Figure 2:
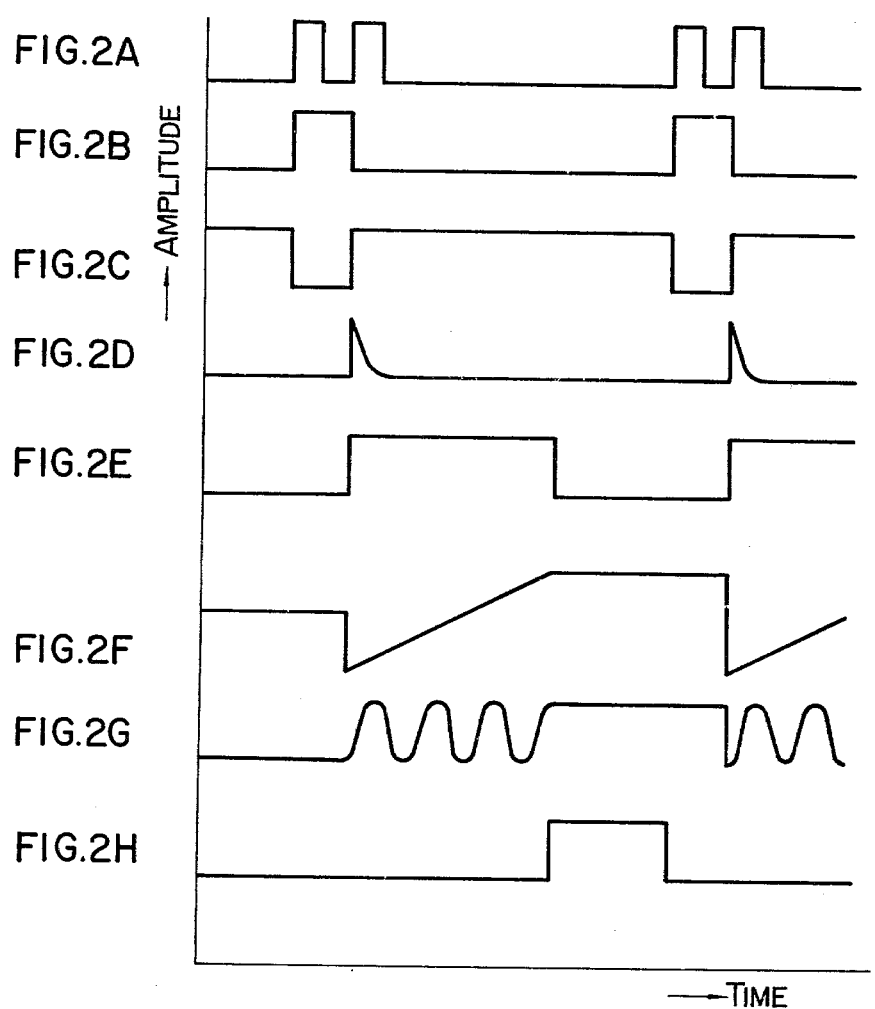
FIG. 2A to FIG. 2H show signal waveforms at various points in the circuit of FIG. 1 for explaining the operation of FIG. 1.

The output signal (d) of the differentiation circuit is applied to the preset terminal of the register 31b. Since the output signal (d) rises at the rise of the second key pulse as shown in FIG. 2, the coded signal for the tens digit of the channel number is no longer produced at the second output terminal 9 of the encoder 7, but instead the coded signal for the unit digit of the channel number is produced. Therefore, the coded signal for the unit digit is stored in the register 31b. Since the output signal (b) falls when the output signal (d) rises, the coded signal for the unit digit of the channel number is not stored in the register 31a. Accordingly, the 4-bit coded signal for the tens digit of the channel number is stored in the register 31a while the 4-bit coded signal for the unit digit of the channel number is stored in the register 31b. The 4-bit coded signals stored in the registers 31a and 31b are supplied to the 7-segment decoders 32a and 32b, respectively, and LOW level signals or HIGH level signals are produced at seven output terminals of each of the 7-segment decoders 32a and 32b depending on the coded signals. The seven output terminals of each of the 7-segment decoders 32a and 32b are connected to respective segments of each of the 7-segment light emitting diodes 33a and 33b so that those segments of the light emitting diodes which are connected to the HIGH level output terminals of the decoders 32a and 32b emit light to indicate the tens digit of the channel number by the 7-segment light emitting diode 33a and the unit digit of the channel number by the 7-segment light emitting diode 33b.

In FIG. 1, when another channel number is entered by the keyboard 6, the counter 17 is reset by the second differentiated pulse (signal (d)) from the differentiation circuit 13 so that the content of the counter 17 is reset to 0. As a result, the output of the D-A converter 18 falls to zero and the local oscillation frequency falls to the lowest frequency. The output of the differentiation circuit 13 is also applied to the RS flip-flop 14 so that the $\overline{Q}$ output terminal thereof assumes HIGH level. As a result, the pulses from the pulse generator 16 are supplied to the counter 17 through the AND circuit 15 and the counter 17 starts to count up from count 1. Therefore, the output voltage of the D-A converter 18 gradually increases from zero so that the local oscillation frequency gradually rises as described before. The signal (g) is applied to the clock terminal of the counter 10 and the content of the counter 10 is decreased by the number of peaks in the signal (g). When the count reaches zero, that is, when it is ready for the reception of the desired channel, a borrow signal is produced to maintain the output of the D-A converter 18 constant. Thus, the desired channel can be received.

Figure 3:
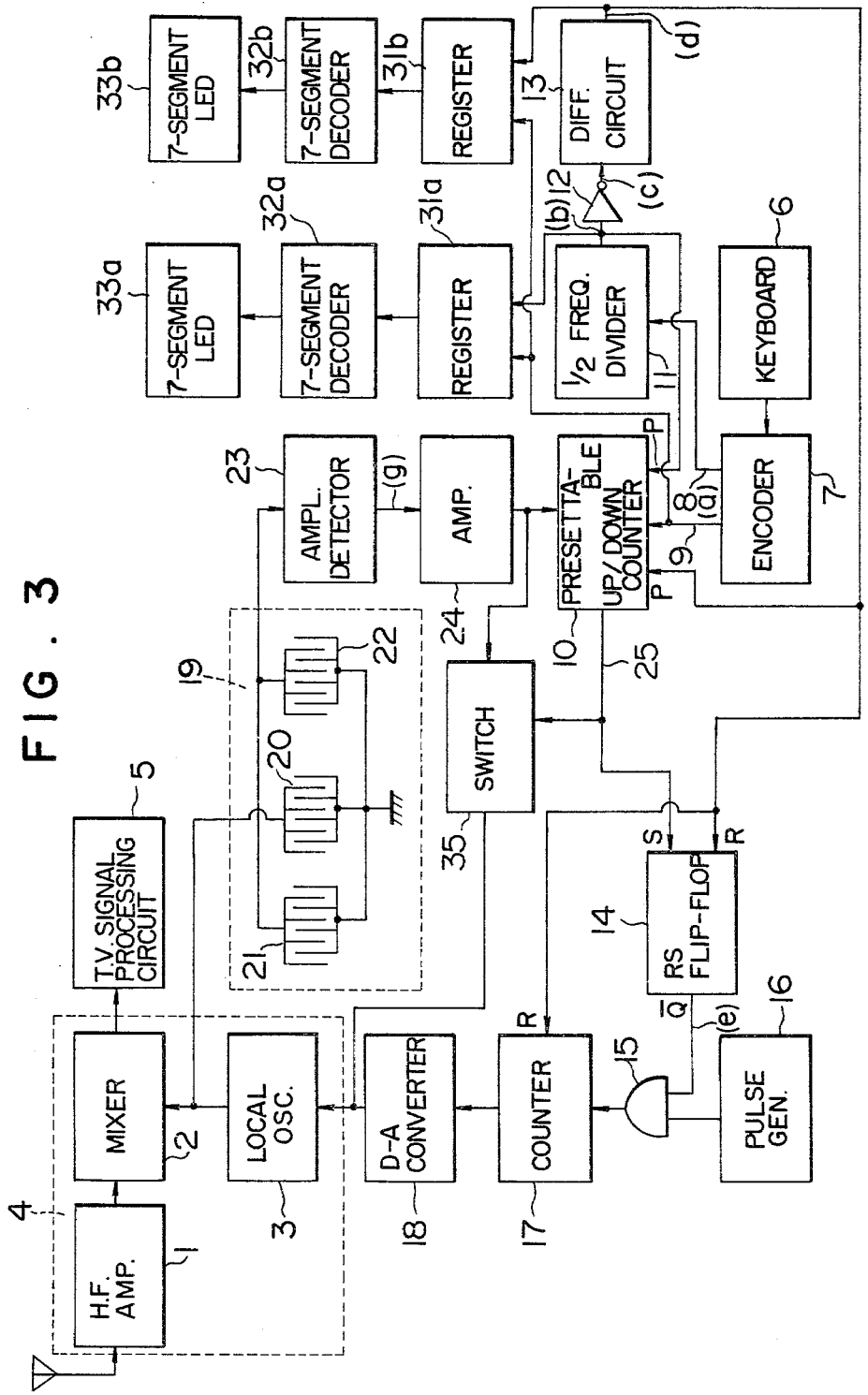
FIG. 3 is a block diagram showing another embodiment of the automatic channel selection apparatus of the present invention.
Figure 4:
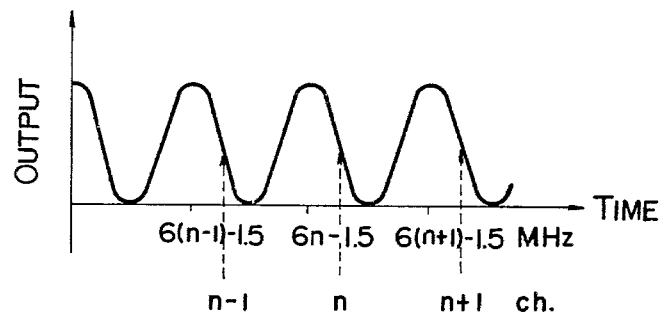
FIG. 4 shows waveforms for explaining the operation of the circuit of FIG. 3.

FIG. 3 shows a block diagram of another embodiment of the automatic channel selection apparatus of the present invention. The embodiment of FIG. 3 differs from the embodiment of FIG. 1 in that a switch 35 is provided, which is turned on by the borrow signal from the borrow terminal 25 of the presettable up/down counter 10, and the output of the amplifier 24 is applied to the local oscillator 3 through the switch 35 as an automatic frequency control voltage. In this embodiment, the oscillation frequency of the local oscillator 3 at which the outputs of the amplitude detector 23 and the amplifier 24 assume the peaks is selected to be approximately 1.5 MHz lower than a normal local oscillation frequency, as shown in FIG. 4.

The operation of the circuit from the entry of the channel number by the keyboard 6 to the stop of the voltage sweep is same as that of the circuit of FIG. 1. When the counter 10 has been counted down by the desired number of channels, the counter 10 produces the borrow signal indicating the completion of the count operation. This borrow signal is supplied to the switch 35 so that the output of the amplifier 24 is supplied to the local oscillator 3 as the AFC voltage. When the counting operation of the counter 10 is completed, the oscillation frequency of the local oscillator 3 is approximately 1.5 MHz lower than the normal oscillation frequency, but when the switch 35 is turned on, the local oscillation frequency rises because the peak of the output voltage of the amplifier 24 shown in FIG. 4 is supplied to the local oscillator 3. As a result, the outputs of the amplitude detector 23 and the amplifier 24 decrease and the local oscillation frequency falls. The above operation is repeated to eventually maintain the local oscillation frequency constant. Thus, in the embodiment of FIG. 3, the AFC is applied simultaneously with the channel selection so that good reception condition can be maintained after the channel selection.

Figure 5A:
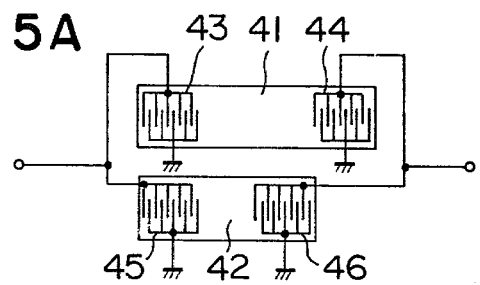
FIGS. 5A, 5B and 5C are plan views showing examples of elastic surface wave elements used in the automatic channel selection apparatus of the present invention.
Figure 5B:
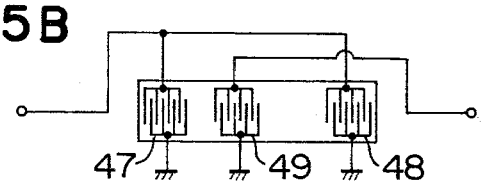
Figure 5C:
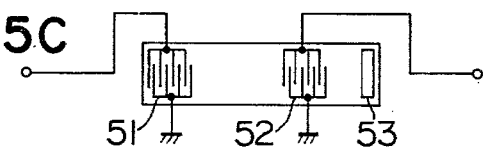

FIGS. 5A to 5C show embodiments of the elastic surface wave element suitable for use in the automatic channel selection apparatus of the present invention. In FIG. 5A a first elastic surface wave element 41 and a second elastic surface wave element 42 are provided, with a distance between an input electrode 43 and an output electrode 44 of the element 41 being different from a distance between an input electrode 45 and an output electrode 46 of the element 42. When the local oscillation signal is applied to the input electrodes 43 and 45, a signal as shown in FIG. 2G is produced at the junction node of the output terminals 44 and 46.

In FIG. 5B, a pair of input electrodes 47 and 48 are provided, with a distance between the input electrode 47 and an output electrode 49 being different from a distance between the input electrode 48 and the output electrode 49. In this embodiment, again, the voltage shown in FIG. 2G is produced.

The acoustic surface wave element shown in FIG. 5C has an input electrode 51, an output electrode 52 and a reflection plate 53. A signal directly transmitted to the output electrode 52 from the input electrode 51 is combined with a signal transmitted from the input electrode 51 to the reflection plate 53 and reflected thereby to the output electrode 52, at the output electrode 52 to produce a combined output. The output electrode 52 produces the signal as shown in FIG. 2G.

As described hereinabove, the present invention overcomes the drawbacks encountered in the prior art automatic channel selection apparatus, enables the direct selection of the desired channel and enables the indication of the selected channel.

What is claimed is

1. An automatic channel selection apparatus comprising:
    an electronic tuner having a local oscillator an oscillation frequency of which is controlled in accordance with an applied voltage;
    a voltage sweep circuit for sweeping the voltage to be applied to said local oscillator;
    means for deriving from an output of said local oscillator, signals of different phases and combining said signals;
    a detector for envelope-detecting an output of said meas; and
    means for counting the number of the output signals of said detector which changes periodically each time the oscillation frequency of said local oscillator changes by a given amount which is inversely proportional to the phase difference between said signals to stop the voltage sweep of said voltage sweep circuit when the count reaches a specified count.

2. An automatic channel selection apparatus comprising:
    an electronic tuner having a local oscillator an oscillation frequency of which is controlled in accordance with an applied voltage;
    a voltage sweep circuit for sweeping the voltage to be applied to said local oscillator;
    means for deriving from an output of said local oscillator, signals of different phases and combining said signals;
    a detector for detecting a combined signal from said means to produce a signal which changes at a cycle period which is inversely proportional to the phase difference between said signals;
    a channel number entry device;
    a counter for counting up the output of said detector by the number corresponding to a channel number entered by said channel number entry device and producing an end of count signal when the counting operation is completed; and
    means responsive to said end of count signal from said counter for stopping the voltage sweep of said voltage sweep circuit.

3. An automatic channel selection apparatus according to claim 2 further comprising a switch connected to apply the output of said detector to an input terminal of said local oscillator and being adapted to be turned on by said end of count signal, whereby said output signal of said detector is supplied to said local oscillator at the time of the completion of the counting operation to carry out automatic frequency control.

4. An automatic channel selection apparatus according to claim 2 further comprising a register for storing the channel number entered by said channel number entry device, a multi-segment light emitting diode, and a decoder for decoding a channel number supplied from said register to produce voltages for indicating the channel number by said multi-segment light emitting diode.

5. An automatic channel selection apparatus according to claim 1 or 2 wherein said means for deriving from the output of said local oscillator the signals of different phases and combining those signals includes an input electrode and first and second output electrodes with a distance between said input electrode and said first output electrode being selected to be different from a distance between said input electrode and said second output electrode.

* * * * *